United States Patent [19]

Gulla et al.

[11] 4,419,183

[45] Dec. 6, 1983

[54] ETCHANT

[75] Inventors: Michael Gulla, Sherborn; Marc Connelly, Roslindale, both of Mass.

[73] Assignee: Shipley Company Inc., Newton, Mass.

[21] Appl. No.: 458,956

[22] Filed: Jan. 18, 1983

[51] Int. Cl.$^3$ .............................. C23F 1/00; B44C 1/22
[52] U.S. Cl. .................................. 156/666; 156/659.1; 156/902; 252/79.2; 252/79.4; 427/96; 427/309
[58] Field of Search ...................... 134/41; 427/96–98, 427/309, 430 A, 436, 437, 444; 156/666, 901, 902, 659.1; 252/79.2, 79.4

[56] References Cited

U.S. PATENT DOCUMENTS 3,650,959 3/1972 Shipley et al. ................. 156/666 X
4,144,119 3/1979 Dutkewych et al. ........... 156/666 X

FOREIGN PATENT DOCUMENTS 48-42537 12/1973 Japan ................................. 156/666

OTHER PUBLICATIONS

Hydrogen Peroxide, W. C. Schumb et al., Reinhold Publishing Corporation, New York, NY. pp. 467–469 & pp. 496–498, 1965.

*Primary Examiner*—William A. Powell

[57] ABSTRACT

An etchant, especially for copper, comprising sulfuric acid and hydrogen peroxide and characterized by the inclusion of a small amount of tungsten in an amount sufficient to increase the surface area of the etched metal.

20 Claims, No Drawings

ETCHANT

BACKGROUND OF THE INVENTION

1. Introduction

This invention relates to a sulfuric acid-hydrogen peroxide etchant and more particularly, to an etchant that provides a roughened, relatively porous etched surface.

2. Description of the Prior Art

The activation of relatively dilute mineral acids with an oxygen release compound is known in the art and described, for example, in Plating, "Surface Treatment of Metals with Peroxygen Compounds", Volume 42, page 561 (1955). In the Plating publication, it is taught that mineral acids such as sulfuric acid, nitric acid, and phosphoric acid may be activated with oxygen release compounds such as hydrogen peroxide or other peroxy, persulfate or perborate compounds. The oxygen release compound permits etching a metal with a decreased acid concentration. The most commonly used acid is sulfuric acid and the most commonly used oxygen release compound is hydrogen peroxide.

Sulfuric acid-hydrogen peroxide etchants are used to etch a variety of metals in many different processes. A common use of such an etchant is as a final etchant in the manufacture of printed circuit boards where an insulating backing is provided with a copper coating, 35 or 70 $\mu$m thick, which is printed with an etch resistant printing ink, or photoresist, on the portions to be retained as copper lines after etching. After the resist has been applied, etching is affected by immersion or spraying the printed circuit base material with an etchant to dissolve the copper which is not protected by the resist. For such an application, the etchant is formulated to provide a rapid rate of dissolution so that all of the metal can be removed rapidly.

Etchants find uses other than as a final etchant to remove a full thickness of copper in the manufacture of printed circuit boards. For example, in the manufacture of double sided through-hole printed circuit boards, the copper cladding is first electrolessly and then electrolytically plated with copper, as are the walls of the through-holes before application of a resist pattern. Before electroless plating, the copper cladding must be properly prepared. Preparation typically includes the steps of cleaning and mildly etching the copper cladding. The purpose of cleaning and etching is to remove dirt and copper oxides so as to promote a strong bond between the copper cladding and the subsequently applied copper plate.

Ammonium persulfate etchants have been used in the prior art as a pre-etch to remove copper oxide and to etch copper preparatory to plating the copper cladding. The use of ammonium persulfate for this purpose is desirable as it provides an etched surface that, on a microscopic level, is pitted and porous whereby the surface area of the copper cladding is increased. The increased surface area enhances the bond between a subsequently applied copper plate and the copper cladding. There are also disadvantages to the use of an ammonium persulfate etchant, the most notable one stemming from the instability of the persulfate and the need for waste treatment of ammonium salts. In use, ammonium persulfate decomposes within several days of its use and must be replaced with fresh solution. This, coupled with the requirement for waste treatment, adds to the cost of manufacture of the printed circuit boards.

Sulfuric acid-hydrogen peroxide etchants can be stabilized so that they are capable of use for extended periods of time and such etchants have been previously used for preparation of copper cladding for subsequent electroless copper deposition. However, good adhesion between a subsequently applied electroless copper plate and the copper cladding is unreliable using the prior art etchants, particularly when using copper plating solutions capable of rapidly depositing copper.

SUMMARY OF THE INVENTION

The subject invention provides a sulfuric acid-hydrogen peroxide etchant formulated for etching copper prior to electroless copper deposition whereby good and consistent adhesion between the cladding and the deposited copper is achieved regardless of the rate of deposition of the copper from solution. The invention is based upon the discovery that the addition of a solution soluble compound of tungsten, preferably a tungstate, results in an etchant capable of providing a deeper etch. It is postulated that on a microscopic scale, the deep etching better exposes grain boundaries and increases the overall surface area which improves mechanical bonding between the copper cladding and the subsequently deposited electroless copper.

Based upon the above, it is an object of this invention to provide an etchant formulation that may be used as a pre-etch to prepare a copper surface for subsequent plating.

It is another object of this invention to provide a process for metal plating over copper characterized by pretreatment of the surface with the etchant of this invention to promote adhesion between the surface and a subsequently applied metal plate.

It is a further object of this invention to provide a process for the fabrication of printed circuit boards characterized by the step of pretreatment of copper cladding with the etchants of this invention to promote adhesion between a copper surface and a subsequently applied metal plate.

Other objects and advantages of the invention will be apparent from the description which follows.

DESCRIPTION OF THE PREFERRED EMBODIMENTS

The hydrogen peroxide content of the etchant of the invention may vary within rather broad limits though preferably the peroxide content varies between about 0.1 and 3.5 moles per liter dependent upon the desired activity of the etchant. For use of the etchant as a pre-etch in accordance with the objects of this invention, the peroxide content is preferably maintained low because etch rate is not a significant factor. Consequently, the preferred concentration ranges from about 0.2 to 1.0 moles per liter of solution.

The sulfuric acid content likewise may vary within wide limits dependent upon the desired strength of the etchant. Therefore, though the sulfuric acid content can vary between about 0.5 and 7.5 moles per liter, it preferably varies between about 1 and 2.5 moles per liter of solution.

The invention is based upon the addition of a solution soluble source of tungsten to the etchant as it is this material that is responsible for penetration of the etchant into the surface of the metal to form the desired deeply etched surface. Any solution soluble source of tungsten is suitable, but an alkali metal tungstate, especially sodium tungstate, is preferred. The concentration of tungsten in solution is small relative to the other ingredients as the addition of tungsten in excessive concentration can cause rapid decomposition of the hydrogen peroxide. Consequently, the concentration of the tungsten in solution is that amount required to provide the above described adhesion which amount can vary between about 0.00005 and 0.005 moles per liter of solution, and more preferably varies between about 0.0001 and 0.001 moles per liter of solution.

In accordance with a preferred embodiment of the invention, the etchant is stabilized to prevent catalytic decomposition of the peroxide caused by the presence of metallic impurities. Though most stabilizers known to the art may be used, the preferred stabilizers are arylsulfonic acids or salts thereof as disclosed in U.S. Pat. No. 3,801,512 incorporated herein by reference. A preferred stabilizer is phenol sulfonic acid. Other stabilizers that may be used include sulfosalicylic acid and toluene sulfonic acid. The concentration of the sulfonic acid may vary from as low as 0.5 grams per liter of solution to the solubility limit of the stabilizer, but preferably varies between about 1 and 15 grams per liter of solution.

The etchants of the invention are used in a conventional manner. The substrate bearing the copper layer to be etched is immersed in a solution of the etchant at a temperature varying between about room temperature and 150° F., preferably at a temperature varying between about 100° and 120° F., for a time sufficient to clean and etch the surface. The time is temperature dependent and typically varies between about 1 and 5 minutes. As a general guideline, the time is that time necessary to form a surface having a matte finish.

The etchants of this invention are particularly useful for the manufacture of printed circuit boards where metal plating is to take place over the etched surface. Procedures for the formation of printed circuit boards are described in numerous publications, for example, in Coombs, PRINTED CIRCUIT HANDBOOK, McGraw-Hill Publishing Co., New York, N. Y., 1967, Chapter 5, incorporated herein by reference.

In a process for the manufacture of printed circuit boards, a suitable base material is selected such as copper clad epoxy. Holes are drilled at appropriate locations over the surface of the board and the copper cladding is prepared for plating such as by cleaning and then etching with the etchants of this invention. Prior to plating, the walls of the holes and the cladding are metalized, typically with copper to provide electrical contact between the two surfaces of the base material. Methods for metalization are known and include the steps of catalyzing and electroless copper deposition. Using the etchants of this invention, the bond between the copper cladding and the electroless copper should be strong. Following metallization of the holes and the cladding, in one embodiment, utilizing a process known as pattern plating, a conductor pattern is formed on the copper by application of an organic resist material which may be either a photoresist or a screen resist dependent upon design and required definition. The resist coats the copper that is not part of the conductor pattern and leaves the copper bare in the conductor pattern. The thickness of the conductor pattern is then increased using electroless and/or electrolytic copper plating procedures. Following the step of copper plating, a dissimilar metal etch resist, such as solder, is applied over the copper and the conductor pattern to protect the same from subsequently applied etchants, the organic resist is removed exposing the unwanted copper (not part of the conductor pattern) and the unwanted copper is dissolved with a suitable etchant for the copper such as that disclosed herein while the conductor pattern is protected from the etchant by the dissimilar metal etch resist. Typically, the dissimilar metal etch resist is selected not only for its ability to withstand the etchant, but also for its solderability so that electrical connections can be soldered directly to the etch resist.

An alternative to pattern plating is a process known as panel plating. The procedure is similar to pattern plating except that the copper is built to full thickness prior to application of the resist. The remaining steps are essentially the same. The process is less desirable as it involves deposition of larger quantities of copper and hence, is less economical.

The invention will be better understood by reference to the following examples.

EXAMPLE 1

Hydrogen peroxide (35%, ml): 100
Sulfuric acid (50%, ml): 200
Phenol sulfonic acid (gm): 1
Sodium tungstate (gm): 0.12
Phosphoric acid (85%, ml): 1
Water: to 1 liter The above etchant was used to etch the copper of an epoxy clad circuit board base material by immersion of the base material in the etchant maintained at 120° F. for 3 minutes. Upon removal of the base material from the etchant, the copper had a matted appearance.

Following etching of the base material, the copper cladding was plated with about 30 millionths of an inch of electroless copper from a CP-78 copper bath available from Shipley Company Inc. and overcoated with about 2 mils of electrolytic copper. Thereafter an attempt was made to delaminate or break the copper to copper bond between the copper clad and the plated copper. It was found that the cladding separated from the epoxy substrate without separation occuring between the copper cladding and the plated copper evidencing strong adhesion between the copper layers.

EXAMPLE 2

A printed circuit board is prepared from a copper clad G-10 substrate using the following sequence of steps:
(a) Drill holes at appropriate locations and clean and etch the copper using the formulation and procedure of Example 1.
(b) Metallize the walls of the holes by electroless plating including the steps of catalysis with a catalyst such as Catalyst 6F of Shipley Company Inc., accelerate with a mild acid solution and electrolessly plate copper such as with copper mix CP-78.
(c) Apply a positive working photoresist such as AZ-119, expose and develop.
(d) Electroplate copper to full desired thickness.
(e) Apply immersion tin over the exposed copper.
(f) Remove the photoresist by dissolution in a suitable solvent.
(g) Remove exposed copper by immersion of the epoxy coated board in the etchant of Example 1, absent the tungstate additive, until all unwanted copper is dissolved.

We claim:

1. In a composition for etching a metal surface comprising sulfuric acid in an amount of at least 0.5 moles per liter and hydrogen peroxide in an amount of at least 0.1 moles per liter, the improvement comprising as an additive to the solution, a solution soluble source of tungsten in an amount sufficient to increase the surface area of the metal surface.

2. The composition of claim 1 where the tunsten is present in an amount of at least 0.00005 moles per liter.

3. The composition of claim 2 where the peroxide content varies between about 0.1 and 3.5 moles per liter.

4. The composition of claim 3 where the peroxide content varies between about 0.2 and 1.0 mole per liter.

5. The composition of claim 2 where the sulfuric acid content varies between 0.5 and 7.5 moles per liter.

6. The composition of claim 5 where the sulfuric acid content varies between 1 and 2.5 moles per liter.

7. The composition of claim 2 having a composition comprising 0.2 to 1.0 moles per liter of hydrogen peroxide, 1.0 to 2.5 moles per liter of sulfuric acid and from 0.0001 to 0.001 moles per liter of a solution source of tunsten.

8. The composition of claim 7 where the solution soluble source of tungsten is sodium tunstate.

9. The composition of claim 7 containing a stabilizer for hydrogen peroxide.

10. The composition of claim 9 where the stabilizer is an aryl sulfonic acid.

11. The composition of claim 9 where the stabilizer is phenol sulfonic acid.

12. A process for preparing a copper surface for metal deposition, said process comprising contact of the surface with an etchant comprising sulfuric acid in an amount of at least 0.5 moles per liter, hydrogen peroxide in an amount of at least 0.1 moles per liter and a solution soluble source of tungsten in an amount of at least 0.00005 moles per liter, said contact being for a time sufficient to form a matte surface over the copper.

13. The process of claim 12 where the etchant comprises from 0.2 to 1.0 moles per liter of hydrogen peroxide, 1.0 to 2.5 moles per liter of sulfuric acid and from 0.0001 to 0.001 moles per liter of a solution soluble source of tungsten.

14. The process of claim 13 where the copper surface is a copper clad circuit board base material.

15. The process of claim 14 including the step of depositing an electroless metal over the etched copper surface.

16. The process of claim 15 where the electroless metal is copper.

17. The process of claim 13 where the etchant contains a stabilizer for hydrogen peroxide.

18. The process of claim 17 where the stabilizer is an aryl sulfonic acid.

19. The process of claim 17 where the stabilizer is phenol sulfonic acid.

20. The process of claim 14 where the electroless copper is deposited on the surface of the copper and onto walls of holes drilled through the copper clad and the circuit board base material.

* * * * *